United States Patent [19]

Becker

[11] Patent Number: 5,223,785

[45] Date of Patent: Jun. 29, 1993

[54] APPARATUS FOR AND METHOD OF LATCHING AND UNLATCHING INTEGRATED CIRCUIT TEST SOCKETS

[75] Inventor: Donald G. Becker, Milpitas, Calif.

[73] Assignee: Intelmatec Corporation, Fremont, Calif.

[21] Appl. No.: 908,977

[22] Filed: Jul. 6, 1992

[51] Int. Cl.[5] ............................................. G01R 31/00
[52] U.S. Cl. .................................. 324/158 F; 414/416
[58] Field of Search ...................... 414/416; 324/158 F

[56]  References Cited
U.S. PATENT DOCUMENTS 5,073,079 12/1991 Akagawa ........................... 414/416

Primary Examiner—P. W. Echols
Attorney, Agent, or Firm—Heller, Ehrman, White & McAuliffe

[57] ABSTRACT

An apparatus for opening and closing lids of sockets has a carrier plate controllably movable horizontally in a specified direction and a roller disposed transversely thereabove. A board carrying rows of sockets thereon is set on the carrier plate so as to be moved perpendicularly to the direction of the rows. Plungers can be lowered so as to selectably press down lugs on the lids of these sockets so as to release engaged latches of these sockets or another kind of lugs for completely closing and latching them. The lids are biased so as to normally remain in open position unless they are latched. As the carrier plate moves the board under the roller, the lids in open position come into contact therewith and are nearly completely closed. The plungers are so positioned as to be directly above the lugs for closing the lids and latching them when the roller brings these lids into the nearly completely closed position.

9 Claims, 6 Drawing Sheets

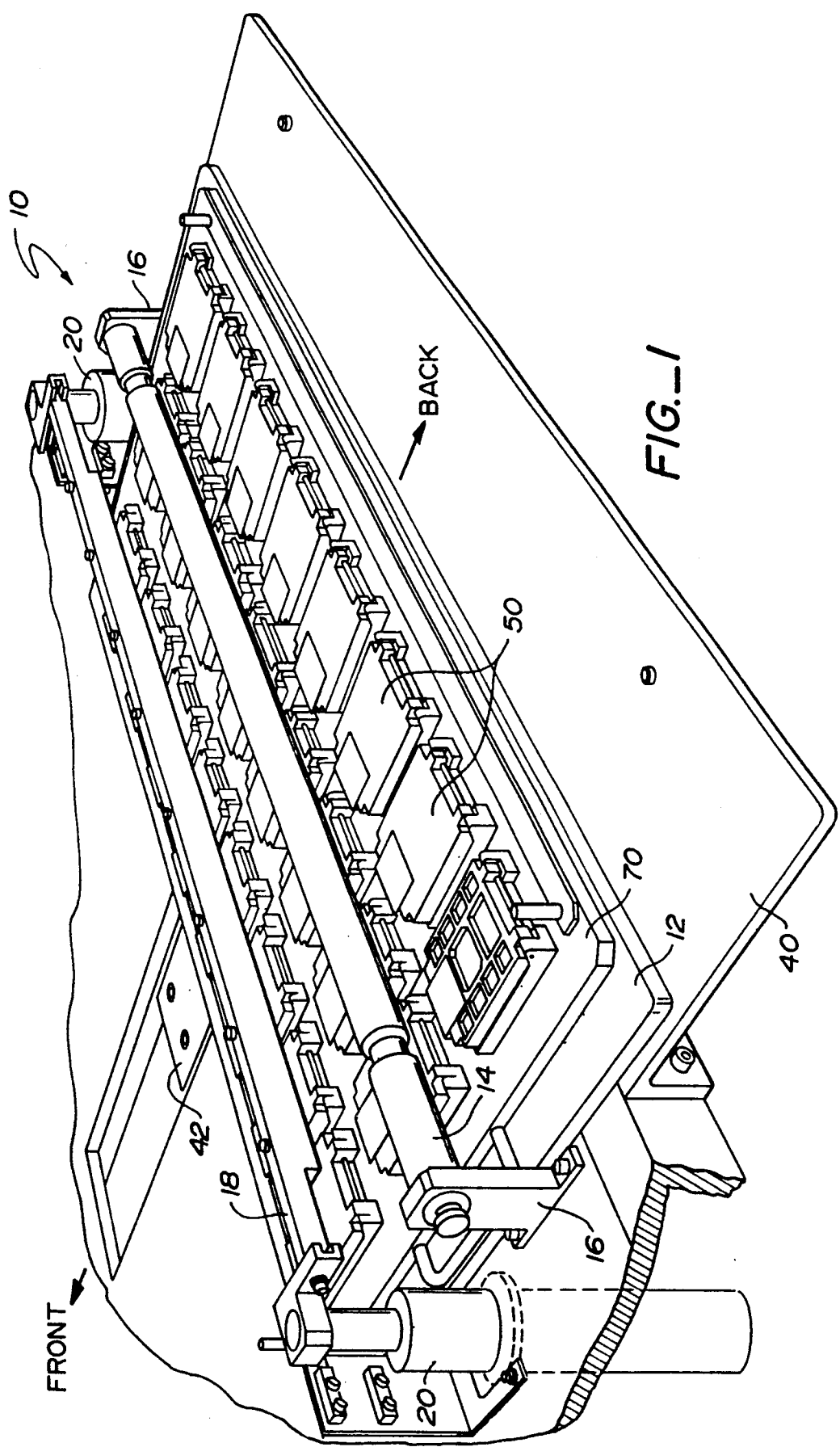
FIG._1

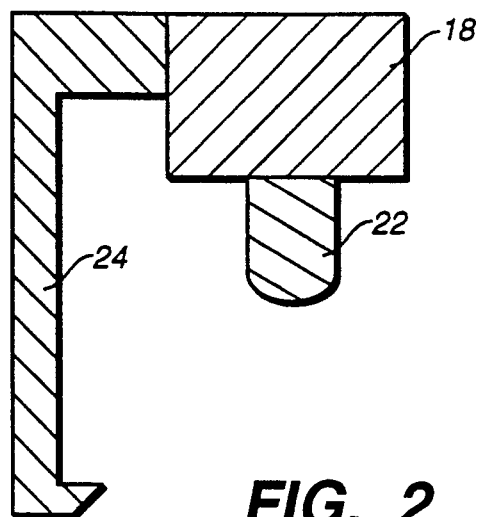
FIG._2
FIG._3
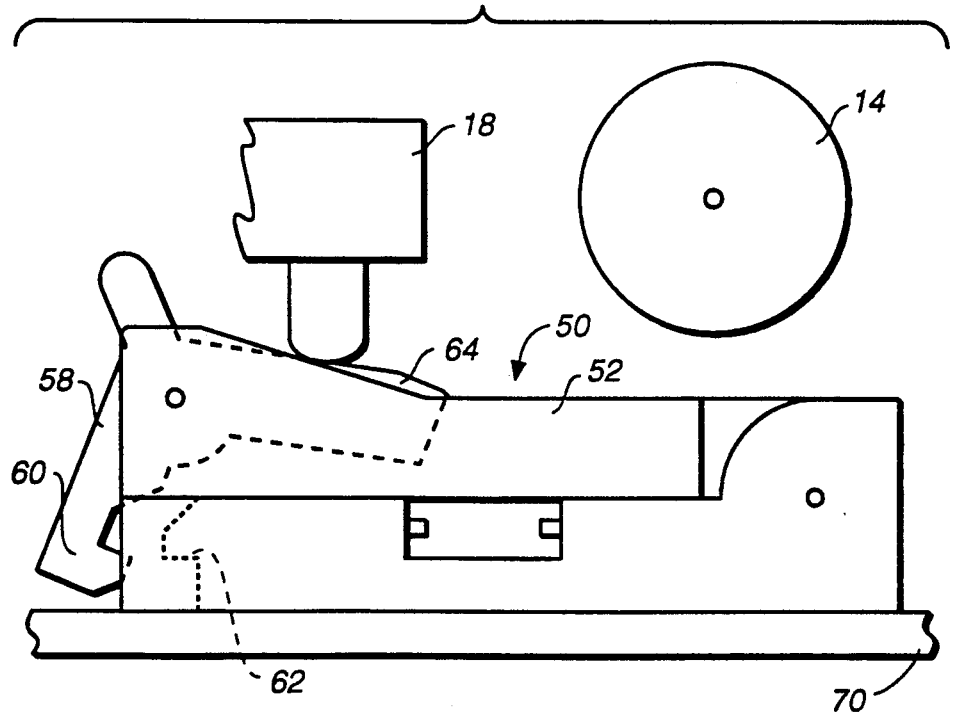

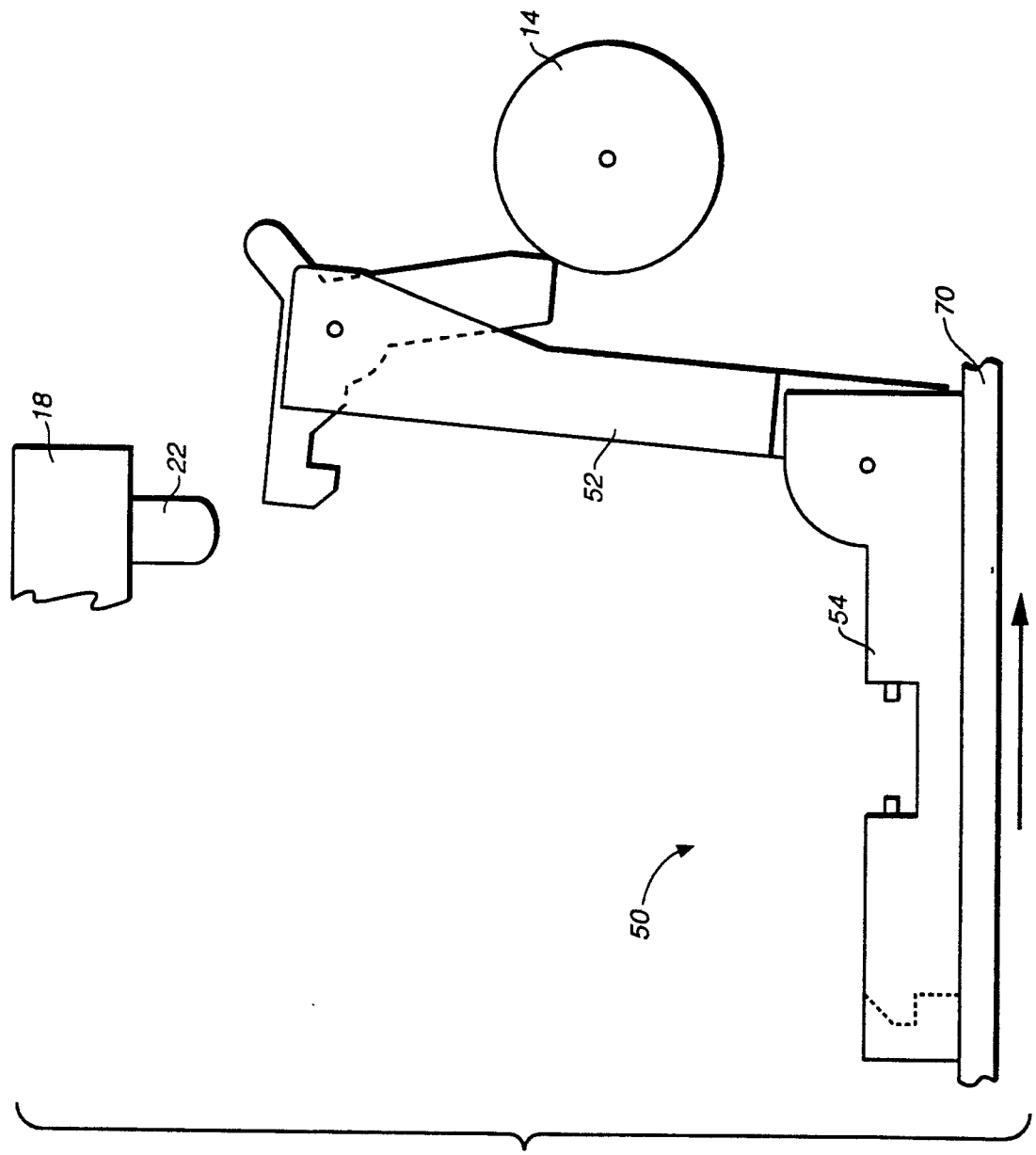
FIG._4

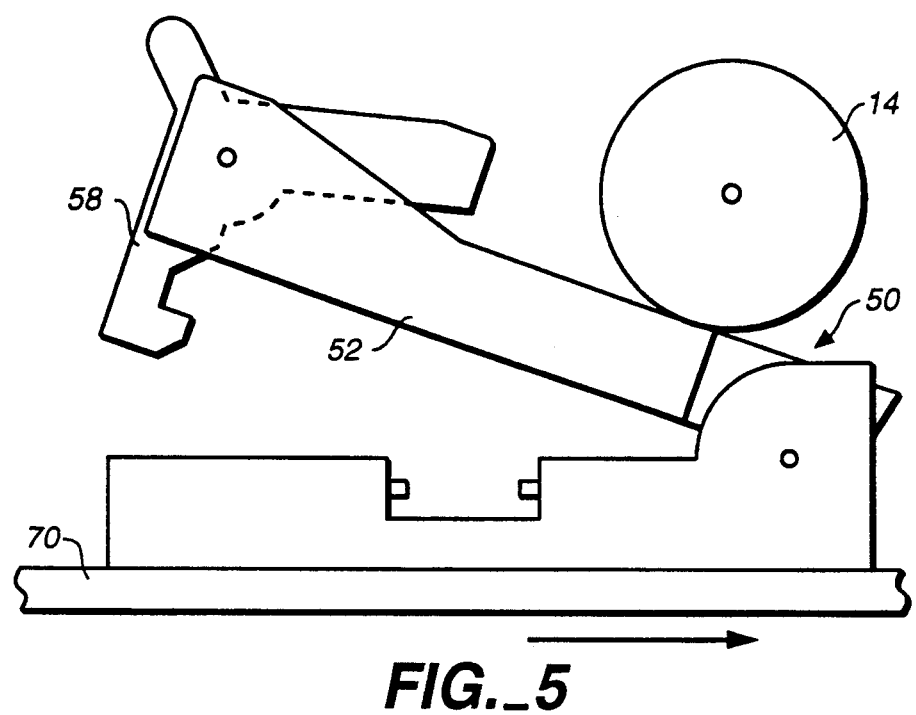
FIG._5
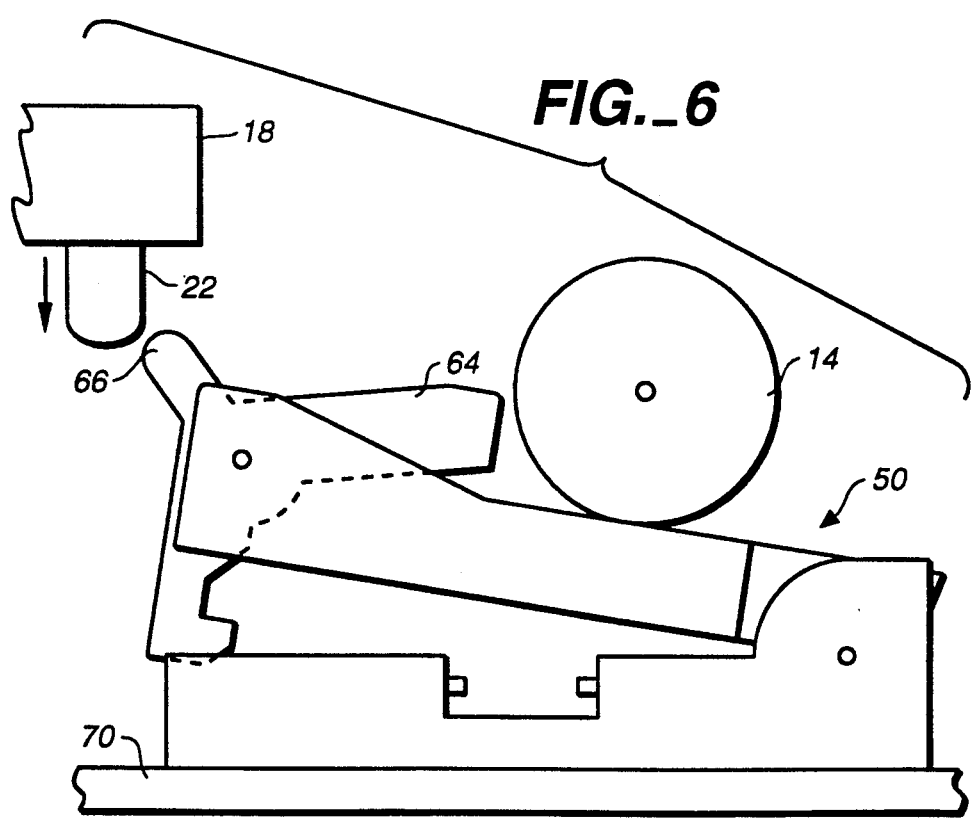
FIG._6

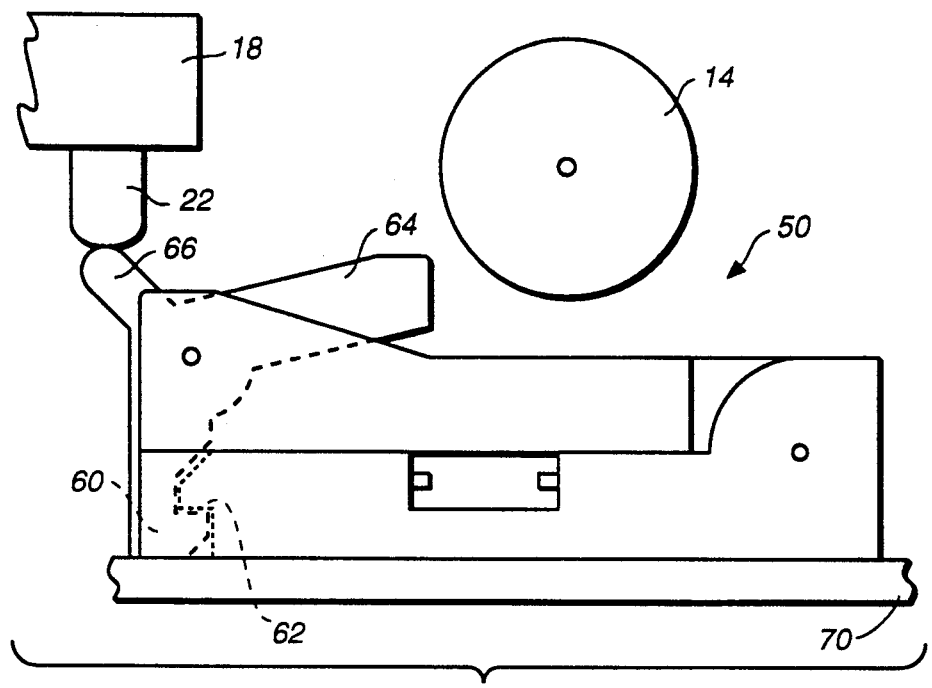
FIG._7
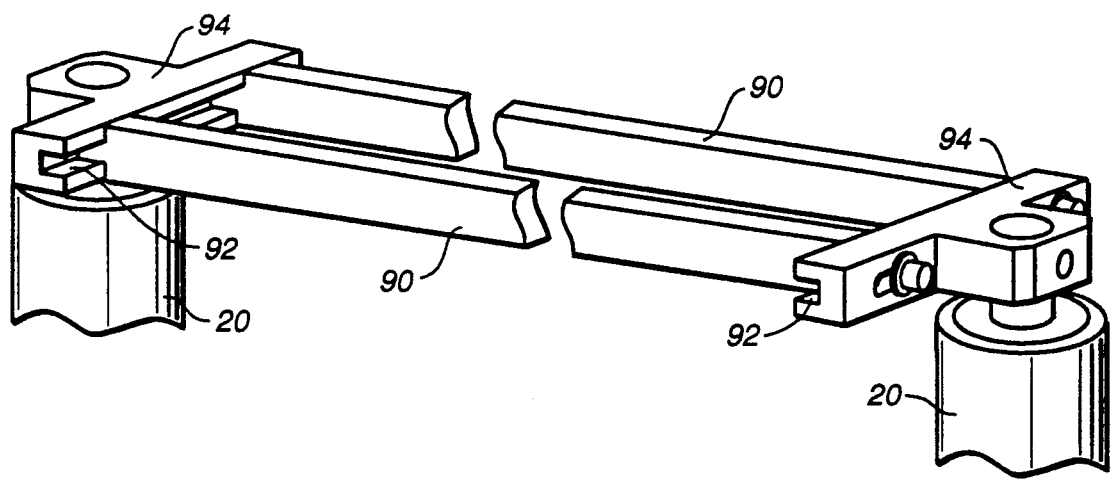
FIG._8

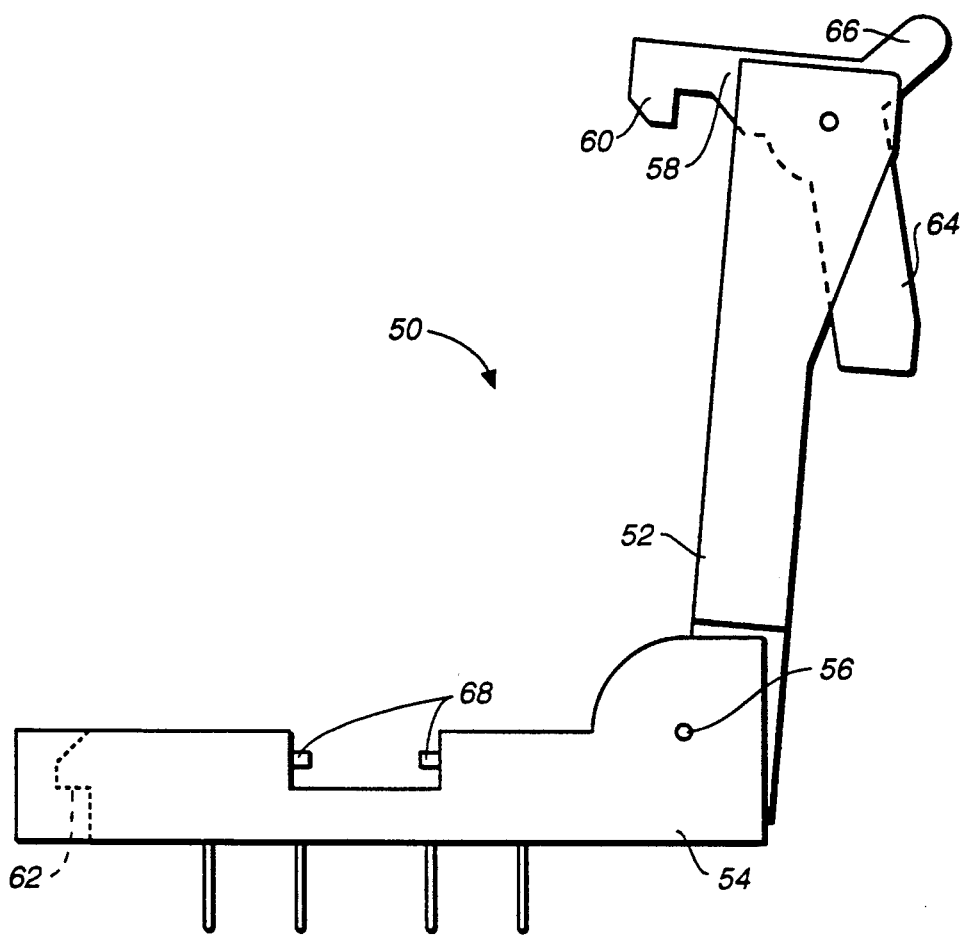
FIG._9
(PRIOR ART)
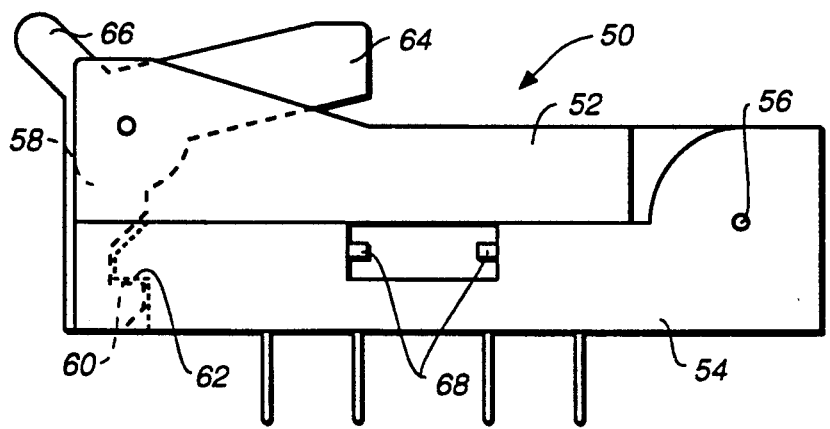
FIG._10
(PRIOR ART)

APPARATUS FOR AND METHOD OF LATCHING AND UNLATCHING INTEGRATED CIRCUIT TEST SOCKETS

BACKGROUND OF THE INVENTION

This invention relates to an apparatus for, and a method of, automatically latching to close and unlatching to open test sockets aligned on a burn-in board in order to load them with integrated circuits (ICs) to be tested or to undergo a burn-in process and also to remove these processed integrated circuits out of these sockets.

Packaged ICs are usually tested or sent in for a burn-in process by way of a socket (also called a test socket or a burn-in socket). Many such sockets are equipped with a lid or cover plate which serves the purpose of positioning and holding the ICs in place such that intimate contact is made between the IC leads and the contact pins on the socket. As shown in FIGS. 9 and 10, a socket of this type, generally indicated at 50, may have its lid 52 rotatably supported by its housing 54 around a support axis 56. A biasing spring (not shown) is provided such that the lid 52 will normally assume an open position shown in FIG. 9. In order to keep the lid 52 closed during a testing or burn-in process, a lever piece 58 is rotatably supported by the lid 52, a latch 60 being provided at one end of this lever piece 58 so as to be able to engage with a ledge 62 formed on the housing 54. Another biasing spring (not shown in FIG. 1) is provided so as to keep the lever piece 58 normally in the angular position with respect to the lid 52 as shown both in FIGS. 9 and 10. When the lid 52 is completely closed, this biasing spring serves to keep the latch 60 in the engaged position with respect to the ledge 62 as shown in FIG. 10. The lever piece 58 has two lugs 64 and 66 (herein referred to as the unlatching lug 64 and the latching lug 66, respectively) protruding in different directions from where it is axially supported by the lid 52. In FIGS. 9 and 10, numerals 68 indicate contact pins for contacting leads of the IC (not shown) to be loaded for a testing or burn-in process.

Typically, a large number of such sockets are arranged on a plate such as a burn-in board so that a large number of ICs can be tested or processed at the same time. It is both time-consuming and cumbersome to manually unlatch and open the lids of these many sockets prior to loading them with ICs and closing them by latching after they are loaded, or to open them by unlatching after a testing or burn-in process is completed and to close them again after the tested or processed ICs are removed from them.

It is therefore an object of the present invention to provide an apparatus for and method of automatically and efficiently latching to close and unlatching to open a large number of sockets of the type described above arranged on a plate such as a burn-in board.

SUMMARY OF THE INVENTION

An apparatus embodying the present invention, with which the above and other objects of the invention can be accomplished, comprises a carrier plate for supporting thereon a burn-in board or the like on which such sockets as described above are arranged in mutually perpendicular rows and columns. The carrier plate may be set on the top surface of a work table serving as its base and having a servo motor and a control device for controlling the operation of its various components such that the carrier plate is controllably movable horizontally on the base in a specified direction. A rotatably supported horizontal roller extends above but close to the carrier plate perpendicularly to the specified direction, such that sockets with their lids remaining open will hit it as they are passed underneath. There is also provided a supporting member which is controllably movable vertically upward and downward, with plungers protruding downward therefrom corresponding to the row of sockets on the board.

In order to open the lids of closed sockets in a row by unlatching them, the sockets in this row are brought under the plungers and the supporting member is lowered such that the plungers press down the unlatching lugs on these sockets. In order to load such sockets or to unload and then reload them, the carrier plate may be further moved to an appropriate work station.

In order to close the lids of open sockets in a row by latching, the carrier plate is moved such that these open sockets approach the roller from such direction that their open lids, after contacting the roller, will start to close by being pushed by the roller until they are nearly completely closed as the carrier plate continues to move. The carrier plate is stopped when the latching lugs of these sockets are directly under the plungers, which are then lowered so as to press down the latching lugs of these sockets, completely closing them by latching.

BRIEF DESCRIPTION OF THE DRAWINGS

The accompanying drawings, which are incorporated in and form a part of this specification, illustrate an embodiment of the invention and, together with the description, serve to explain the principles of the invention. In the drawings:

FIG. 1 is a perspective rear view of an apparatus according to the present invention installed on a horizontal top surface of a work table with means for controllably moving the carrier plate and the pneumatic pumps;

FIG. 2 is a sectional side view of the clamp bar shown in FIG. 1;

FIGS. 3-7 are schematic side views of a socket on the burn-in board for showing various stages in the operation of the apparatus of FIG. 1, FIG. 3 showing the moment when the socket is closed and is being unlatched, FIG. 4 showing the socket moving backward and coming into contact with the roller, FIG. 5 showing the roller pressing down the lid of the socket, FIG. 6 showing the roller nearly completely closing the socket, and FIG. 7 showing the lid being completely closed and becoming latched;

FIG. 8 is a perspective view of a component for replacing the clamp bar shown in FIGS. 1 and 2;

FIG. 9 is a side view of a test socket of a conventional type in unlatched open position; and FIG. 10 is a side view of the test socket of FIG. 9 in closed latched position.

DETAILED DESCRIPTION OF THE INVENTION

FIG. 1 shows an apparatus 10 as installed on the top horizontal surface 40 of a work table such as a multi-tasking transfer system Model MTTS-100 produced and sold by the assignee herein and also disclosed in U.S. Pat. No. 5,073,079 issued Dec. 17, 1991 and assigned to the assignee herein. (U.S. Pat. No. 5,073,079 will be herein incorporated by reference.) A large number of sockets 50 are arranged on a rectangular burn-in board 70 in straight rows and columns, all oriented in the same direction. FIG. 1 illustrates an example of such a burn-in board with 8 columns, that is, 8 sockets in each row.

The burn-in board 70, thus loaded with a large number of sockets 50, is placed on top of a carrier plate 12 which engages with a mechanism including a servo motor (which may be a part of the work table) for moving the carrier plate 12 controllably in the forward-backward direction as indicated by arrows in FIG. 1. A portion of this mechanism for communicating power from the servo motor to the carrier plate 12 is indicated by numeral 42 in FIG. 1.

A cylindrical roller 14 is disposed above the carrier plate 12 and is rotatably supported by support members 16 fastened to the table surface 40, the roller 14 extending laterally across the carrier plate 12. Its height, or its vertical distance from the top surface of the carrier plate 12 is determined by the design of the sockets 50 to be handled by the apparatus 10, as will be explained more in detail below.

In front of the roller 14 and parallel thereto, there is a clamp bar 18 supported at both its ends by pneumatic actuators 20 such that the clamp bar 18 can be raised or lowered, while remaining horizontal. As more clearly shown in FIG. 2, vertically extending plungers 22 are affixed to the clamp bar 18 at positions corresponding to the columns of the sockets 50 on the burn-in board 70. The plungers 22 are thus adapted to move vertically with the clamp bar 18 by the operation of the pneumatic actuators 20. The horizontal separation (in the forward-backward direction) between the roller 14 and the plungers 22 is also determined by the design of the sockets 50 to be handled by the apparatus 10, as will be explained more in detail below. Both the aforementioned servo motor adapted to move the carrier plate 12, and hence also the burn-in board thereon, in the forward-backward direction and the pneumatic actuators 20 for moving the clamp bar 18 vertically are controlled by a control device (which is also a part of the work table and not shown in FIG. 1) according to a predefined program which will also be described in detail below.

The operation of the apparatus 10 thus structured will be described next with reference to FIGS. 3-7. For the convenience of explanation, let us assume that the plurality of sockets 50 arranged on the burn-in board 70 as shown in FIG. 1 are initially all latched and closed as shown in FIG. 10, whether or not they each contain an integrated circuit. After the board 70 is placed at a specified position on the carrier plate 12 in front of the clamp bar 18, the servo motor serving as the power source for the carrier plate 12 is activated such that the carrier plate 12 is advanced backward until the unlatching lugs 64 on the lever pieces 58 of the sockets 50 in a selected row are directly below the plungers 22. The servo motor is stopped then, and the pneumatic actuators 20 are activated so as to cause the clamp bar 18, and hence also the plungers 22 to move downward, causing the plungers 22 to press the unlatching lugs 64 of the sockets 50 in the selected row as shown in FIG. 3. As the unlatching lug 64 is thus pressed downward, the lever piece 58 rotates in the clockwise direction (with reference to FIG. 3) against the biasing force thereon which normally keeps the latch 60 engaged with the ledge 62 on the socket 50, thereby disengaging the latch 60 from the ledge 62. As soon as the latch 60 is thus disengaged from the ledge 62, the clamp bar 18 is raised again, causing the lids 52 of the sockets 50 in the selected row to spring open by the biasing force thereon so as to assume the open position shown in FIG. 9. The servo motor is then activated so as to move the carrier plate 12 in the forward direction.

With the sockets in the selected row open, they may be loaded if they are empty, or may be unloaded and then reloaded if they are already loaded. For such loading, unloading and reloading operations, use may be made of a gripper of any kind, such as disclosed in U.S. Pat. No. 4,911,490 assigned to the present assignee. In order to close these sockets in the selected row, the carrier plate 12 is moved backward. The clamp bar 18 is at a raised position at this moment such that the open lids 52 of the sockets 50 in the selected row will pass under the plungers 22 without contacting them, but the roller 14 behind the clamp bar 18 is sufficiently low such that these open lids 52 will come into contact therewith as the carrier plate 12 moves backward as indicated by an arrow in FIG. 4.

As the carrier plate 12 continues to move further backward, the open lids 52 of the sockets 50 in the row are pushed against the biasing force thereon by the roller 14. (The support members 16 for the roller 14 are not shown in FIGS. 3-7.) This situation is illustrated in FIG. 5. The backward motion of the carrier plate 12 is stopped when the latching lugs 66 of these sockets 50 are directly under the plungers 22 as shown in FIG. 6.

At this moment, the clamp bar 18 is lowered such that the plungers 22 not only press down the latching lugs 66 as shown in FIG. 7, but also completely close these sockets 50, causing their lever pieces 58 to rotate against the biasing force thereon and their latches 60 to engage with the corresponding ledges 62. The clamp bar 18 is immediately raised thereafter to clean the way under the plungers 22 and the carrier plate 12 is moved such that the unlatching lugs 64 of the sockets 50 in another selected row will come immediately below the plungers 22 in the manner shown in FIG. 3. The sequence described above is thereafter repeated on the sockets 50 in the next and other rows.

As shown in FIG. 2, the clamp bar 18, according to a preferred embodiment of the invention, is provided not only with the plungers 22 but also with hooks 24. The springs for providing biasing force may sometimes be stuck or otherwise malfunction, failing to open the lids 52 when they are unlatched and expected to open. In such a situation, the clamp bar 18 is lowered to unlatch the lids 52. The servo motor is activated while the clamp bar 18 is in a lowered position so as to index the carrier plate 12 slightly. After the hook 24 is engaged with the lids 52, the clamp bar 18 is raised again.

The present invention has been described above with reference to only one example, but many modifications and variations are conceivable thereon within the scope of the invention. For example, the apparatus as described above can be easily modified for opening and closing so-called open-top sockets, for example, of a kind produced and sold by Maruichi Corporation of Tokyo, Japan, which are normally closed and can be opened by simply pressing down their edge parts against biasing forces thereon. For this purpose, an accessory as shown in FIG. 8 with two parallel bars 90 may be used as a replacement for the clamp bar 18 shown in FIGS. 1 and 2. Both ends of the bars 90 are slidable in grooves 92 formed in supporting members 94 affixed at the top of the pneumatic actuators 20 such that the interval therebetween can be easily adjusted according to the type of the open-top sockets to be handled.

In summary, any such modifications and variations that may be apparent to a person skilled in the art are intended to be included within the scope of this invention.

What is claimed is:

1. An apparatus for automatically latching to close and unlatching to open lids of sockets, said lids being each supported by corresponding one of said sockets rotatably between a closed position and an open position and biased so as to normally assume said open position, each of said lids supporting a lever rotatably between a latched position and an unlatched position, said lever being capable of latching in said latched position to said corresponding one of said sockets and being biased so as to normally assume said latched position, said lever having two lugs adapted to be pushed so as to rotate said lever in mutually opposite directions respectively towards said latched and unlatched positions, said apparatus comprising:

a base;

a carrier plate capable of being controllably moved horizontally backward and forward in a specified direction on said base, a plurality of said sockets being aligned in rows on a board set on said carrier plate, said rows being perpendicular to said specified direction;

a roller rotatably supported by said base above said carrier plate and extending perpendicularly to said specified direction, said roller being so disposed as to be able to come into contact with, push and nearly completely close those of said lids in said open position as said board is transported in said specified direction on said carrier plate; and plungers which are supported by said base so as to be controllably movable vertically upward and downward and aligned parallel to said roller, said plungers being mutually spaced apart so as to be able to be lowered and to thereby press down either of said lugs on each of said sockets in any of said rows.

2. The apparatus of claim 1 wherein said plungers and said roller are so disposed relative to each other that said plungers can be lowered to press down said latching lugs of said sockets in a specified one of said rows when said sockets in said specified row are so positioned with respect to said roller that the lids of said sockets in said specified row are being held down by said roller and are nearly completely closed.

3. The apparatus of claim 1 further comprising plate-moving means for controllably moving said carrier plate in said specified direction.

4. The apparatus of claim 3 wherein said plate-moving means include a servo motor supported by said base.

5. The apparatus of claim 1 further comprising pneumatic actuators for controllably raising and lowering said plungers.

6. The apparatus of claim 1 further comprising a hooking device attached to supporting means for supporting said plungers, said hooking device protruding further downward below said plungers so as to be able to unlatch said lever on each of those of said sockets.

7. A method of latching to close and unlatching to open lids of sockets, each of said lids being supported by corresponding one of said sockets rotatably between a closed position and an open position and biased so as to normally assume said open position, each of said lids supporting a lever rotatably between a latched position and an unlatched position, said lever being capable of being latched in said latched position to said corresponding one of said sockets and being biased so as to normally assume said latched position, said lever having an unlatching lug and a latching lug for being pushed so as to cause said lever to rotate respectively towards said unlatched position and towards said latched position; said method comprising the steps of:

providing an apparatus having a base, a carrier plate capable of being controllably moved horizontally backward and forward in a specified direction on said base, a roller rotatably supported by said base above said carrier plate and extending perpendicularly to said specified direction, plungers which are supported by said base so as to be controllably movable vertically upward and downward and aligned perpendicularly to said specified direction at fixed intervals therebetween;

setting said sockets on a board in rows at said fixed intervals;

positioning said board on said carrier plate such that said rows are perpendicular to said specified direction and that said sockets and said plungers are aligned with respect to each other;

thereafter positioning said carrier plate such that said sockets in a specified one of said rows are in front of said plungers, those of said sockets in said selected row having their lids closed and latched thereto;

thereafter causing said carrier plate to move controllably backwards until said sockets in said selected row have their unlatching lugs directly below said plungers;

thereafter moving said plungers downward such that said plungers push down said unlatching lugs of said sockets in said selected row, thereby unlatching and opening said lids on said sockets in said selected row;

thereafter moving said carrier plate backward until said roller pushes down and nearly closes said opened lids of said sockets in said selected row and said latching lugs of said sockets in said selected row are directly under said plungers; and thereafter moving said plungers downward such that said plungers push down said latching lugs associated with said nearly closed lids, completely closing said nearly closed lids by latching.

8. The method of claim 7 wherein said apparatus is also provided with a hook capable of controllably moving vertically up and down, said method further comprising the steps of lowering said hook until said hook engages said lever of said sockets in said selected row and raising said hook so as to unlatch said lids of said sockets in said selected row.

9. The method of claim 8 wherein said hook and said plungers are bother affixed to a supporting member so as to move together.

* * * * *